(12) United States Patent
Middleton et al.

(10) Patent No.: US 9,859,678 B2
(45) Date of Patent: Jan. 2, 2018

(54) COMMUNICATIONS DEVICE WITH OPTICAL INJECTION LOCKING SOURCE AND RELATED METHODS

(71) Applicant: HARRIS CORPORATION, Melbourne, FL (US)

(72) Inventors: Charles Middleton, Rockledge, FL (US); Richard DeSalvo, Satellite Beach, FL (US); Scott L. Meredith, Vero Beach, FL (US); Peter S. Scheuter, Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 461 days.

(21) Appl. No.: 14/494,051

(22) Filed: Sep. 23, 2014

(65) Prior Publication Data
US 2017/0026125 A1 Jan. 26, 2017

(51) Int. Cl.
*H04B 10/2575* (2013.01)
*H01S 5/00* (2006.01)

(52) U.S. Cl.
CPC ..... *H01S 5/0085* (2013.01); *H04B 10/25758* (2013.01)

(58) Field of Classification Search
CPC ............. H04B 10/2504; H04B 10/548; H04B 10/25758; H01S 5/0085; H01S 5/4006
USPC .................................................. 398/115–117
See application file for complete search history.

(56) References Cited

U.S. PATENT DOCUMENTS

| 4,045,120 A | 8/1977 | de Corlieu et al. |
| 4,769,853 A | 9/1988 | Goodwin et al. |
| 4,972,513 A | 11/1990 | Mochizuki et al. |
| 5,121,241 A | 6/1992 | Veith |
| 5,323,406 A * | 6/1994 | Yee .......................... G02F 1/225 385/2 |
| 5,379,309 A * | 1/1995 | Logan, Jr. ............. H01S 5/4006 372/18 |

(Continued)

FOREIGN PATENT DOCUMENTS

JP          11205240 A          7/1999

OTHER PUBLICATIONS

Schneider et al, Radiofrequency signal generation system with over seven octaves of continuous tuning, Jan. 2013, Nature Photonics, pp. 118-122.*

(Continued)

*Primary Examiner* — Ken N Vanderpuye
*Assistant Examiner* — Dibson Sanchez
(74) *Attorney, Agent, or Firm* — Allen, Dyer, Doppelt, Gilchrist, P.A.

(57) ABSTRACT

A communications device may include a remote device having a first E/O modulator to modulate an optical carrier signal with an input signal having a first frequency, an optical waveguide coupled to the remote device, and a local device coupled to the optical waveguide. The local device may include an optical source to generate the optical carrier signal, a second E/O modulator to modulate the optical carrier signal with a reference signal to generate a modulated reference signal, an OIL source coupled to the second E/O modulator and to amplify the modulated reference signal, and an O/E converter coupled to the OIL source and to generate an output signal including a replica of the input signal at a second frequency based upon the reference signal.

23 Claims, 8 Drawing Sheets

(56) References Cited

U.S. PATENT DOCUMENTS

| | | | |
|---|---|---|---|
| 5,687,261 A | 11/1997 | Logan | |
| 5,710,651 A | 1/1998 | Logan, Jr. | |
| 5,859,611 A | 1/1999 | Lam et al. | |
| 5,963,352 A | 10/1999 | Atlas et al. | |
| 6,115,162 A * | 9/2000 | Graves | H04B 10/50 398/1 |
| 6,256,130 B1 | 7/2001 | Bulow | |
| 6,459,519 B1 * | 10/2002 | Sasai | H04B 10/505 398/183 |
| 6,487,004 B1 * | 11/2002 | Strutz | G02F 2/002 359/245 |
| 6,643,417 B2 * | 11/2003 | Strutz | H03D 9/00 385/1 |
| 6,674,969 B1 | 1/2004 | Ogusu | |
| 6,731,922 B1 * | 5/2004 | Strutz | H04B 10/61 359/245 |
| 6,868,254 B2 | 3/2005 | Weissman | |
| 7,634,201 B2 * | 12/2009 | Maleki | G02B 6/29341 356/484 |
| 7,653,318 B2 * | 1/2010 | Li | H04L 7/0075 398/204 |
| 8,417,076 B2 | 4/2013 | Maleki et al. | |
| 8,515,285 B2 * | 8/2013 | DeSalvo | H04B 10/25758 398/140 |
| 8,879,916 B1 * | 11/2014 | Ng | H04B 10/25759 398/115 |
| 2002/0146046 A1 * | 10/2002 | Kim | H01S 5/4006 372/20 |
| 2002/0159668 A1 * | 10/2002 | Williams | G02F 1/065 385/2 |
| 2004/0161250 A1 * | 8/2004 | Kozlowski | H04B 10/60 398/204 |
| 2008/0310464 A1 | 12/2008 | Schneider | |
| 2009/0263137 A1 * | 10/2009 | Hossein-Zadeh | H04B 1/30 398/115 |
| 2009/0297155 A1 * | 12/2009 | Weiner | H04B 1/40 398/115 |
| 2010/0008665 A1 * | 1/2010 | Chen | H04B 10/25759 398/43 |
| 2010/0008680 A1 | 1/2010 | Chen et al. | |
| 2010/0111304 A1 | 5/2010 | Bloch et al. | |
| 2010/0111545 A1 | 5/2010 | Banwell et al. | |
| 2011/0122912 A1 * | 5/2011 | Benjamin | H01S 5/4006 372/50.124 |
| 2011/0150504 A1 * | 6/2011 | Ellis | H04B 10/60 398/203 |
| 2011/0229138 A1 | 9/2011 | Watanabe | |
| 2013/0188962 A1 * | 7/2013 | Middleton | H04B 10/25758 398/116 |
| 2013/0236187 A1 | 9/2013 | Middleton et al. | |
| 2014/0270783 A1 * | 9/2014 | Prather | H04B 10/25752 398/115 |
| 2015/0358086 A1 * | 12/2015 | Foster | H04B 10/5561 398/115 |

OTHER PUBLICATIONS

Middleton et al, Photonic based Low Phase Noise Frequency Synthesis for RF to Millimeter Wave Carriers and Wideband RF to IF Down conversion, Nov. 2011, IEEE, pp. 51-54.*

DeSalvo et al, Scalable Photonic Assisted Wideband Frequency Converter, Jun. 2011, OSA, All Document.*

Karim et al., "High Dynamic Range Microwave Photonic Links for RF Signal Transport and RF-IF Conversion," Journal of Lightwave Technology, vol. 26, No. 15, Aug. 1, 2008, pp. 2718-2724.

Clark et al., "A Phase-Modulation I/Q-Demodulation Microwave-to-Digital Photonic Link," IEEE Transactions on Microwave Theory and Techniques, vol. 58, No. 11, Nov. 2010, pp. 3039-3058.

Pappert et al., "Microwave Fiber Optic Links for Shipboard Antenna Applications," Phased Array Systems and Technology Proceedings, Conf. May 21-25, 2000, abstract only.

Hofstetter et al., "Dispersion Effects in Optical Millimeter-Wave Systems Using Self-Heterodyne Method for Transport and Generation," IEEE Transactions on Microwave Theory and Techniques, vol. 43, Issue 9, Aug. 6, 2002, abstract only.

Schneider et al., "Generation of Millimetre-Wave Signals by Stimulation Brillouin Scattering for Radio Over Fibre Systems," Electronics Letters, vol. 40, No. 23, Nov. 11, 2004, 2 pages.

Yu et al., "Optical Millimeter-Wave Generation of Up-Conversion Using External Modulators," IEEE Photonics Technology Letters, vol. 18, Issue 1, Dec. 19, 2005, abstract only.

Chen et al., "A Radio-Over-Fiber System With a Novel Scheme for Millimeter-Wave Generation and Wavelength Reuse for Up-Link Connection," IEEE Photonics Technology Letters, vol. 18, No. 19, Oct. 1, 2006, pp. 2056-2058.

Jia et al., "A Full-Duplex Radio-Over-Fiber System Based on Optical Carrier Suppression and Reuse," IEEE Photonics Technology Letters, vol. 18, Issue 16, Aug. 21, 2006, abstract only.

Kaszubowska et al., "Remote Downconversion With Wavelength Reuse for the Radio-Fiber Uplink Connection," IEEE Photonics Technology Letters, vol. 18, No. 4, Feb. 15, 2006, pp. 562-564.

Chen et al., "A Novel Radio-Over-Fiber System With Wavelength Reuse for Upstream Data Connection,"IEEE Photonics Technology Letters, vol. 19, No. 6, Mar. 15, 2007, pp. 387-389.

Kuri et al., "Optical Transmitter and Receiver of 24-GHz Ultra-Wideband Signal by Direct Photonic Conversion Techniques," Microwave Photonics International Topical Meeting, Apr. 16, 2007, abstract only.

Lin et al., "Impact of Nonlinear Transfer Function and Imperfect Splitting Radio of MZM on Optical Up-Conversion Employing Double Sideband With Carrier Suppression Modulation," Journal of Lightwave Technology, vol. 26, No. 15, Aug. 1, 2008, pp. 2449-2459.

Chi et al., "Frequency Quadrupling and Upconversion in a Radio Over Fiber Link," Journal of Lightwave Technology, vol. 26, No. 15, Aug. 1, 2008, pp. 2706-2711.

Karim et al., "High Dynamic Range Microwave Photonic Links for RF Signal Transport and RF-IF Conversion," Journal of Lightwave Technology, vol. 26, Issue 15, Aug. 1, 2008, abstract only.

Hsueh et al., "A Novel Bidirectional 60-GHz Radio-Over-Fiber Scheme With Multiband Signal Generation Using a Single Intensity Modulator," IEEE Photonics Technology Letters, vol. 21, Issue 18, Jul. 10, 2009, abstract only.

"100 GHz Ultra-Wdeband (UWB) Fiber-to-the-Antenna (FTTA) System for In-building and In-home Networks," Optics Express, vol. 18, Issue 2, 2010, abstract only, 2 pages.

* cited by examiner

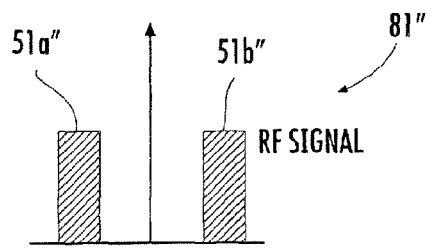
FIG. 10
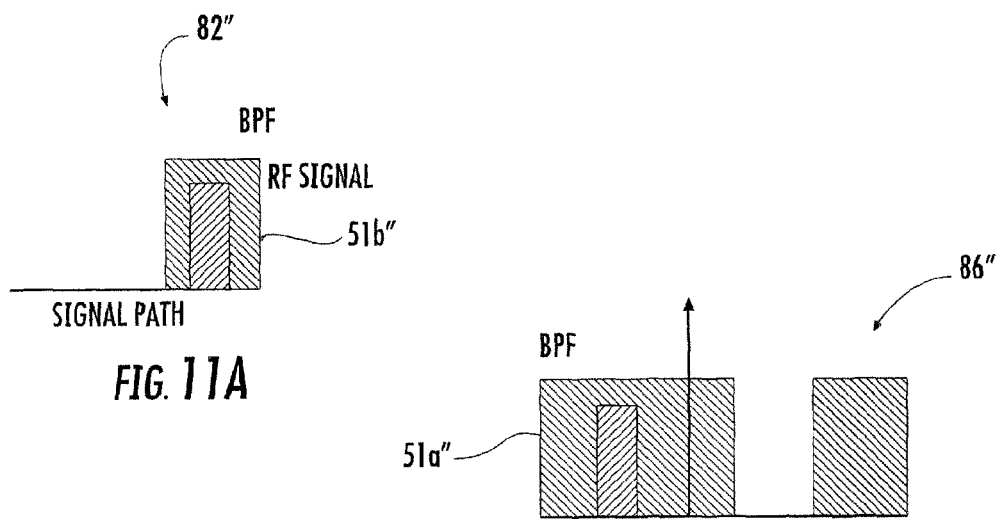
FIG. 11A
FIG. 11B
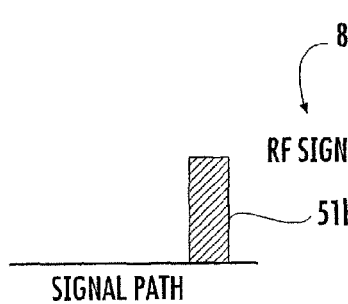
FIG. 12A
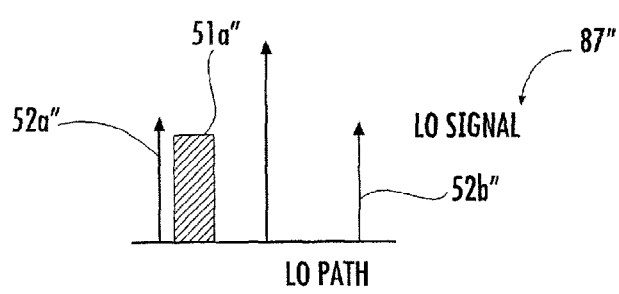
FIG. 12B

COMMUNICATIONS DEVICE WITH OPTICAL INJECTION LOCKING SOURCE AND RELATED METHODS

GOVERNMENT RIGHTS

This present disclosure was made with U.S. government support under Government Contract No. FA8650-10-C-7003. The U.S. Government has certain rights in this disclosure.

TECHNICAL FIELD

The present disclosure relates to the field of communications, and, more particularly, to radio frequency (RF) communications and related methods.

BACKGROUND

A typical wireless communication system comprises a plurality of wireless communications devices exchanging data with each other. In some wireless communication systems, for example, infrastructure networks, the system may further comprise a wireless base station for managing communications between the wireless communications devices. In other words, each intra-system communication would be exchanged via the wireless base station. In other wireless communication systems, for example, mesh networks and ad hoc wireless networks, the wireless base station may be omitted, i.e. the wireless communications devices may communicate directly with each other.

A typical Extremely High Frequency (EHF), i.e. 30 to 300 GHz, communication system operating at this band may have some drawbacks. For example, transmission of the signals over coaxial cable may incur large attenuation effects. Moreover, in applications where RF devices are used, the size, weight, and power (SWaP) of the components may increase to undesirable levels. Moreover, downstream receiver processing, such as downconverting, and signal addressing may be difficult.

One approach to these drawbacks in EHF communication systems may comprise the use of optical components for processing components. An advantage of such systems is the ability to transmit EHF signals from a remote location without the degradation of the signal incumbent in RF applications.

For example, as disclosed in U.S. Pat. No. 5,710,651 to Logan, Jr., an EHF communication system comprises a remote antenna station, a transmitter/receiver station, and an optical fiber coupling the stations together. These stations comprise photodiodes for converting the transmitted optical signal to an electrical signal, and lasers paired with optical modulators for converting the received EHF signal to an optical signal.

Nevertheless, optical applications such as this may be subject to certain drawbacks. For example, the systems may be subject to chromatic dispersion-induced signal fading. In particular, optical heterodyne approaches may be limited by phase noise of laser sources.

U.S. Patent Application Publication No. 2013/0236187 to Middleton et al., also assigned to present application's assignee, the contents of which are hereby incorporated by reference in their entirety, discloses in FIG. 1 a communications device 120 comprising a transmitter device 121 comprising an optical source 122 generating an optical carrier signal, a first electro-optic (E/O) modulator 123 coupled to the optical source and modulating the optical carrier signal with an input signal having a first frequency, and a second E/O modulator 124 coupled to the optical source and modulating the optical carrier signal with a reference signal. The communications device 120 includes a receiver device 125, and an optical waveguide 129 coupled between the transmitter 121 and receiver devices.

The transmitter device 121 includes a first band pass filter 133 coupled downstream from the first E/O modulator 123 and passing (i.e. selecting and rejecting everything else) a carrier frequency sideband, and a second band pass filter 134 coupled downstream from the second E/O modulator 124 and passing a reference signal frequency sideband. The first and second band pass filters 133-134 each comprises a fiber Bragg grating 149, 151 and an associated circulator 148, 152.

The receiver device 125 comprises an optic-electro (O/E) converter 126 including first and second optical detectors 146a-146b coupled to the optical waveguide 129, and a combiner 147 coupled to the first and second optical detectors. The transmitter device comprises an amplifier 127 coupled between the optical source 122 and the first and second E/O modulators 123-124.

Additionally, the transmitter device 121 further comprises an optical splitter 128 coupled between the optical source 122 and the first and second E/O modulators 123-124, and an RF input block 132, such as antenna, coupled to the first E/O modulator. The transmitter device 121 also includes a local oscillator (LO) 131 for generating the reference signal, and a directional coupler 135 coupled between said first and second band pass filters 133-134 and the O/E converter 126. The LO 131 is adjusted to control the frequency conversion of the output signal.

SUMMARY

In view of the foregoing background, it is therefore an object of the present disclosure to provide a communications device that is efficient and robust.

This and other objects, features, and advantages in accordance with the present disclosure are provided by a communications device that may comprise a remote device comprising a first E/O modulator configured to modulate an optical carrier signal with an input signal having a first frequency. The communications device may also include an optical waveguide coupled to the remote device, and a local device coupled to the optical waveguide. The local device may include an optical source to generate the optical carrier signal, a second E/O modulator configured to modulate the optical carrier signal with a reference signal to generate a modulated reference signal, an optical injection locking (OIL) source coupled to the second E/O modulator and configured to amplify the modulated reference signal, and an O/E converter coupled to the OIL source and configured to generate an output signal comprising a replica of the input signal at a second frequency based upon the reference signal. Advantageously, the OIL source may amplify any harmonic of the modulated reference signal for greater operational flexibility.

In particular, the second E/O modulator may be configured to generate the modulated reference signal to comprise a plurality of harmonics, and the OIL source may be configured to amplify a selected harmonic from the plurality thereof. The local device may include a first band pass filter coupled downstream from the first E/O modulator and configured to pass a carrier frequency sideband, and a second band pass filter coupled downstream from the second E/O modulator and configured to pass a reference signal frequency sideband.

In one embodiment, the first band pass filter may include first and second outputs respectively coupled to the second E/O modulator and the O/E converter. In another embodiment, the communications device may further comprise an optical splitter coupled between the optical source and the first and second E/O modulators.

For example, the first frequency may be less than the second frequency, or the first frequency may be greater than the second frequency. The O/E converter may comprise first and second optical detectors coupled to the OIL source, and a combiner coupled to the first and second optical detectors.

Additionally, the communications device may further comprise an amplifier coupled between the optical source and the first and second E/O modulators. The local device may comprise a local oscillator configured to generate the reference signal. The remote device may further comprise an antenna coupled to the first E/O modulator.

Another aspect is directed to a communications method that may comprise generating an optical carrier signal with an optical source; E/O modulating, in a remote device, the optical carrier signal with an input signal having a first frequency; and E/O modulating, in a local device coupled to the remote device via an optical waveguide, the optical carrier signal with a reference signal to generate a modulated reference signal. The communications method may include amplifying the modulated reference signal with an OIL source, and generating an electrical output signal comprising a replica of the input signal at a second frequency based upon the reference signal at the local device.

BRIEF DESCRIPTION OF THE DRAWINGS

FIGS. 10-15 are diagrams illustrating sideband filtering for frequency conversion, in the communications device of FIG. 4.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
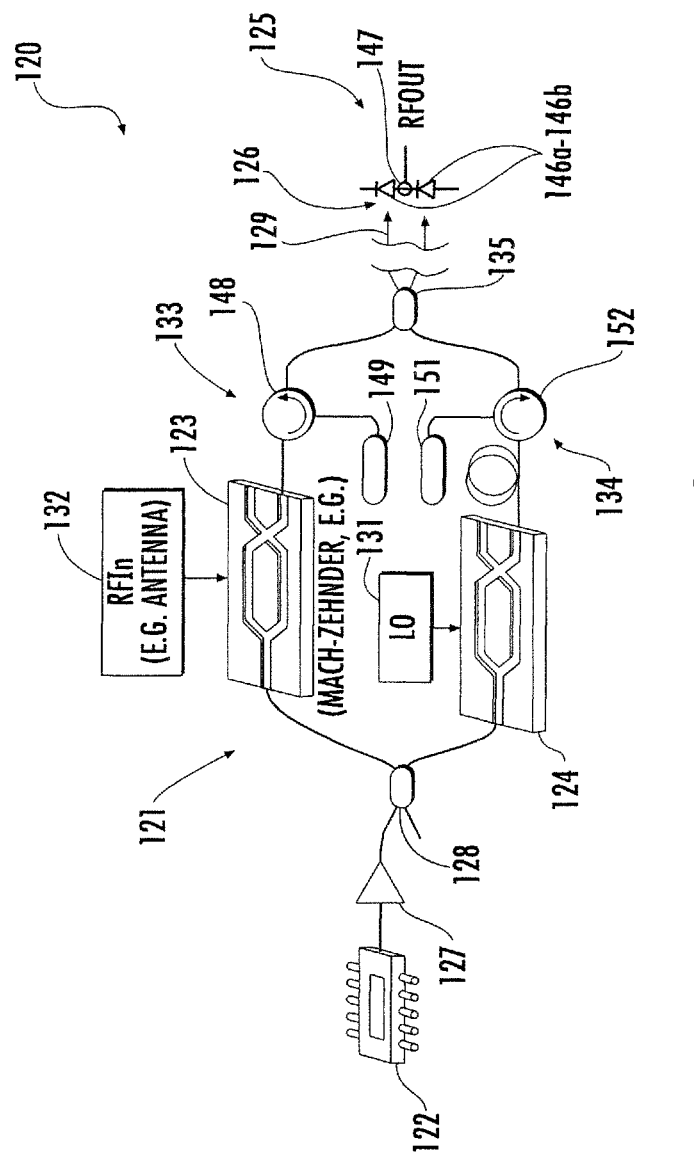
FIG. 1 is a schematic diagram of a communications device, according to the prior art.
Figure 2:
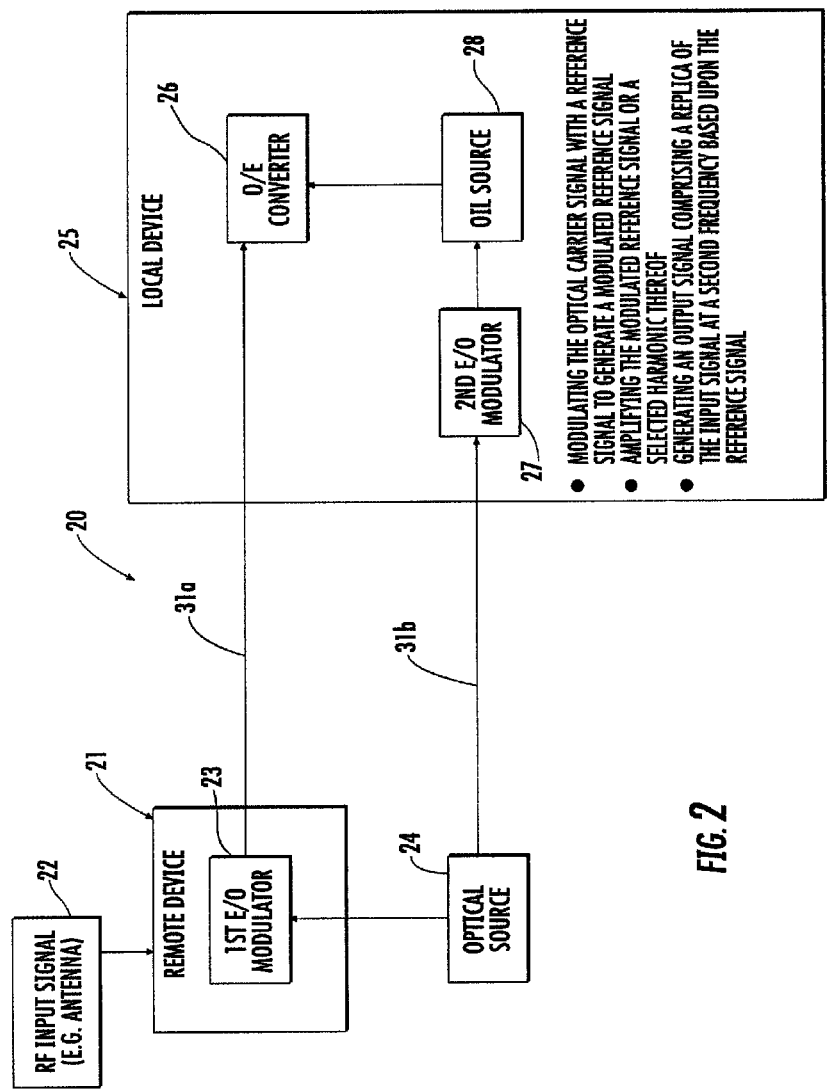
FIG. 2 is a schematic diagram of a communications device, according to the present disclosure.

Referring initially to FIG. 2, a communications device 20 according to the present disclosure is now described. The communications device 20 illustratively includes a remote device 21 comprising a first E/O modulator 23 configured to modulate an optical carrier signal with an input signal 22 having a first frequency. The input signal 22 may be generated from an RF antenna collocated with the remote device 21 and coupled with the first E/O modulator 23 (e.g. long distance RF antenna remoting applications).

The communications device 20 illustratively includes optical waveguides 31a-31b coupled to the remote device 21, and a local device 25 coupled to the optical waveguides. Of course, in remoting applications, the optical waveguides 31a-31b may be many kilometers in length.

Figure 3:
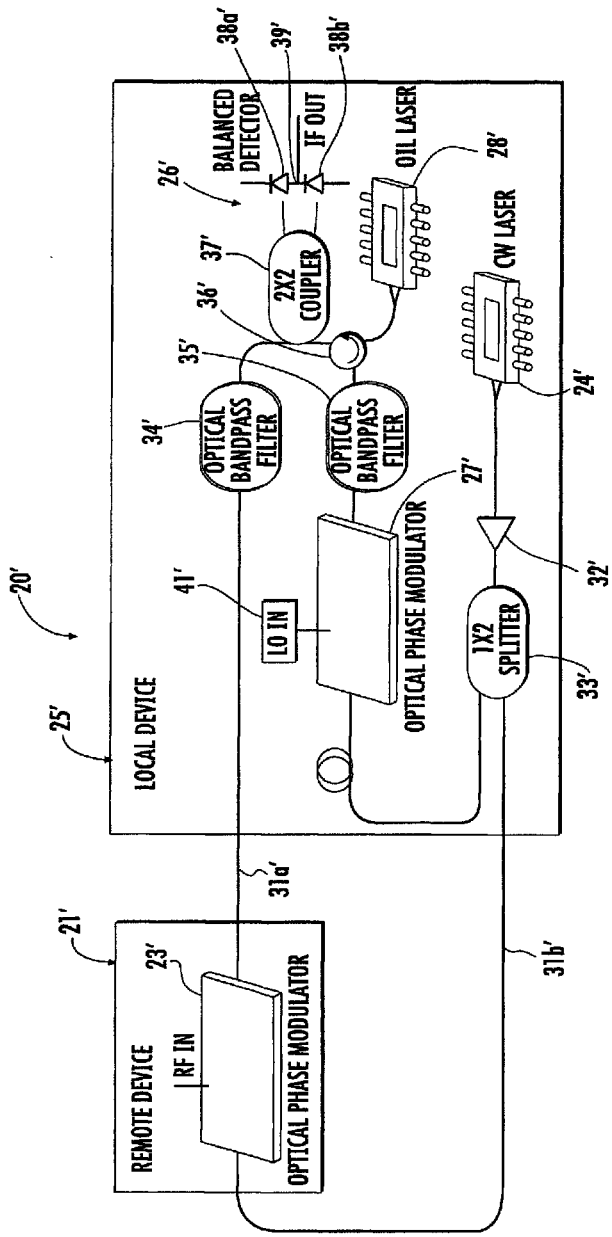
FIG. 3 is a schematic diagram of another embodiment of the communications device, according to the present disclosure.

The local device 25 illustratively includes an optical source 24 configured to generate the optical carrier signal, and a second E/O modulator 27 configured to modulate the optical carrier signal with a reference signal to generate a modulated reference signal. In other embodiments, the optical source 24 may be within the remote device 21. The first and second E/O modulators 23, 27 may comprise optical phase modulators or intensity modulators, for example. In some embodiments (FIGS. 3-4), the reference signal may comprise a local oscillator signal comprising a primary spectral component at the operational frequency of the oscillator. Accordingly, the second E/O modulator 27 is configured to generate the modulated reference signal to comprise a plurality of harmonics. In particular, the modulated reference signal would comprise a plurality of harmonics at integer values of the operational frequency (i.e. the fundamental frequency).

The local device 25 illustratively includes an OIL source 28 coupled to the second E/O modulator 27 and configured to amplify the modulated reference signal. Advantageously, the OIL source 28 may be configured to amplify a selected harmonic (e.g. passed by an upstream band pass filter) from the plurality thereof in the modulated reference signal.

The local device 25 illustratively includes an O/E converter 26 coupled to the OIL source 28 and configured to generate an output signal comprising a replica of the input signal 22 at a second frequency based upon the reference signal. For example, the first frequency may be less than the second frequency, or the first frequency may be greater than the second frequency. In other words, the communications device 20 may operate as an upconverter or a downconverter by selecting the appropriate sideband of the modulated reference signal.

Advantageously, the OIL source 28 may amplify any selected harmonic of the modulated reference signal for greater operational flexibility rather than simply the operational frequency of the reference signal, such as the communications device disclosed in U.S. Patent Application Publication No. 2013/0236187 to Middleton et al. Additionally, the use of the selected harmonic can be done without reduction in signal strength, which would enable use of a low frequency reference signal source to enable millimeter wave conversion.

Moreover, the use of the OIL source 28 for reference signal generation lessens the impact of amplitude fluctuations from the reference signal source, providing a more uniform output signal. The use of the OIL source 28 for reference signal generation provides greater conversion gain than the communications device disclosed in U.S. Patent Application Publication No. 2013/0236187 to Middleton et al., due to the optical amplification of the reference signal. This amplification does not carry with it the noise penalty that an optical amplifier (such as an erbium-doped fiber amplifier) would incur due to spontaneous emission from the amplifier. This benefit of amplification increases the signal distribution capability of the communications device 20, since a signal can be divided (e.g. for a non-blocking switching function) and the loss from signal division can be somewhat compensated by amplification of the reference signal.

Another aspect is directed to a communications method that may comprise generating an optical carrier signal with an optical source 24, E/O modulating, in a remote device 21, the optical carrier signal with an input signal 22 having a first frequency, and E/O modulating, in a local device 25 coupled to the remote device via an optical waveguide, the optical carrier signal with a reference signal to generate a modulated reference signal. The communications method may include amplifying the modulated reference signal with an OIL source 28, and generating an electrical output signal comprising a replica of the input signal at a second frequency based upon the reference signal at the local device 25.

Referring now additionally to FIGS. 3 and 5A-9, another embodiment of the communications device 20' is now described. Also, the spectral operation of the communications device 20' is described with reference to diagrams 71'-79'. In this embodiment of the communications device 20', those elements already discussed above with respect to FIG. 2 are given prime notation and most require no further discussion herein. This embodiment differs from the previous embodiment in that the optical source 24' is included within the local device 25' and the optical carrier signal is transmitted to the remote device 21' via the optical waveguide 31b'. In other embodiments, the optical source 24' could be included within the remote device 21', but these embodiments would require a power source within the remote device 21'.

Additionally, the communications device 20' illustratively includes an amplifier 32' coupled to the optical source 24', and an optical splitter 33' coupled between the optical source and the first and second E/O modulators 23', 27' for directing the amplified optical carrier signal to the first and second E/O modulators (diagrams 71', 75'). The local device 25' illustratively includes a local oscillator 41' configured to generate the reference signal (i.e. local oscillator signal). Once the optical carrier signal is modulated with the input signal at the first E/O modulator 23', the modulated input signal includes first and second sidebands 51a'-51b' (diagram 72'). Also, once the optical carrier signal is modulated with the reference signal at the second E/O modulator 27', the modulated reference signal includes first and second sidebands 52a'-52b' (diagram 76'). As will be appreciated, the bandwidth of the modulated reference signal is concentrated at the operational frequency of the local oscillator 41'.

The local device 25' illustratively includes a first band pass filter 34' coupled downstream from the first E/O modulator 23' and configured to pass a carrier frequency sideband 51b' (diagram 73'), and a second band pass filter 35' coupled downstream from the second E/O modulator 27' and configured to pass a reference signal frequency sideband 52b' (diagram 77').

In this embodiment, the OIL optical source 28' may be an OIL laser source. The local device 25' illustratively includes an optical circulator 36' coupled to the second band pass filter 35' and sending the filtered modulated reference signal 52b' to the OIL source 28', and a 2×2 optical coupler 37' coupled to the optical circulator and the first band pass filter 34'. The OIL source 28' amplifies the filtered modulated reference signal (i.e. the carrier frequency or the selected harmonic thereof) to generate an amplified modulated reference signal 52c' (diagram 78').

Also, this embodiment illustratively includes the O/E converter 26' comprising first and second optical detectors 38a'-38b' coupled to the OIL source 28', and a combiner 39' coupled to the first and second optical detectors. In this embodiment, the first and second optical detectors 38a'-38b' are balanced. The combination of the signal path from the first band pass filter 34' and the OIL source 28' provides an downconverted intermediate frequency signal (diagram 79'). As would be appreciated, the combination would yield an upconversion if the first sideband 51a' was combined with the first reference signal frequency sideband 52b'.

Figure 4:
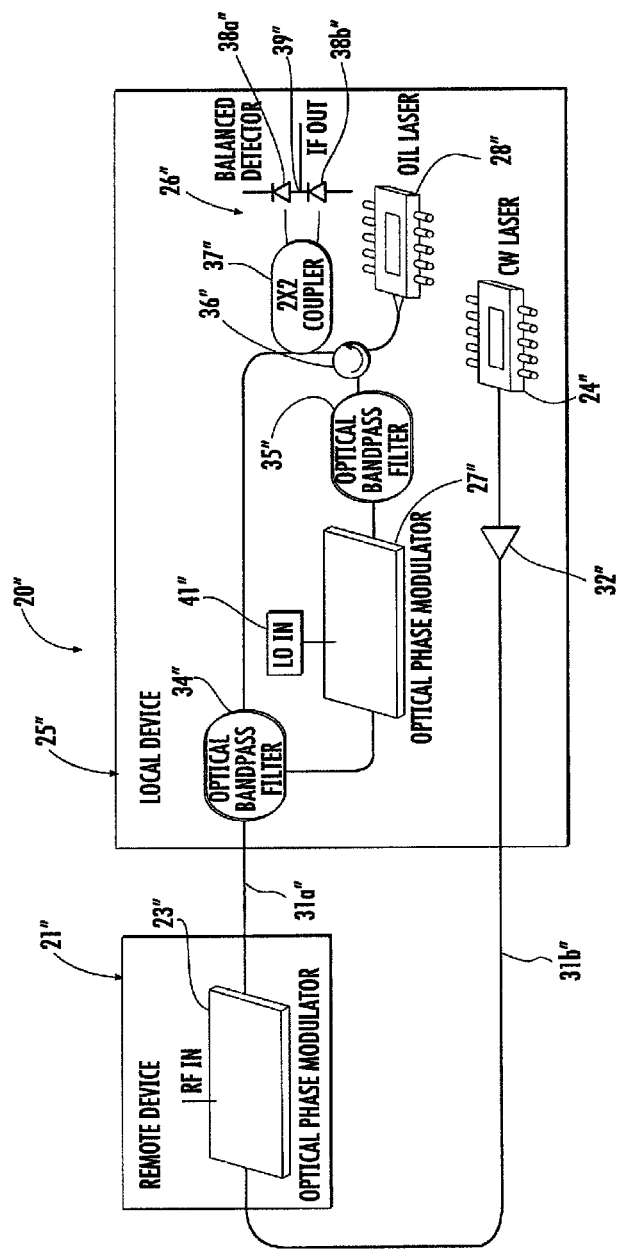
FIG. 4 is a schematic diagram of yet another embodiment of the communications device, according to the present disclosure.
Figure 5A:
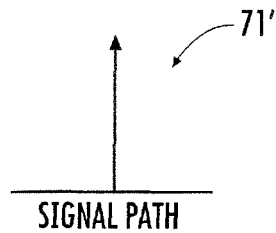
FIGS. 5A-9 are diagrams illustrating sideband filtering for frequency conversion, in the communications device of FIG. 3.
Figure 5B:
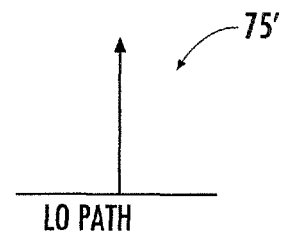
Figure 6A:
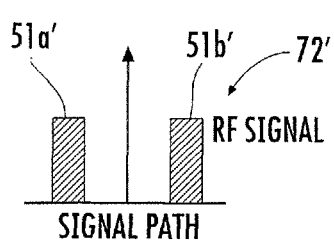
Figure 6B:
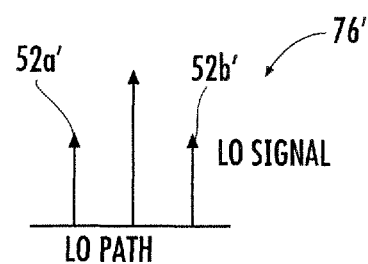
Figure 7A:
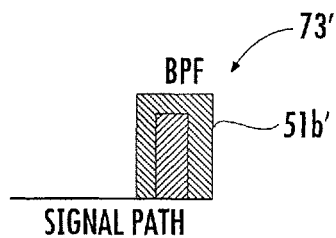
Figure 7B:
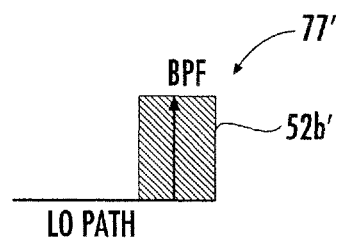
Figure 8A:
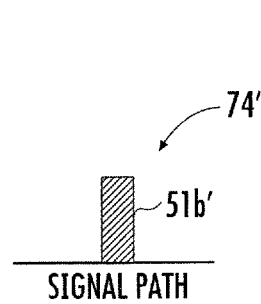
Figure 8B:
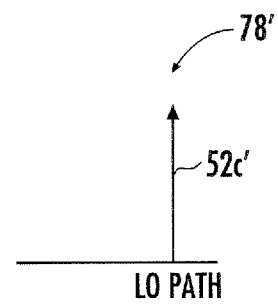
Figure 9:
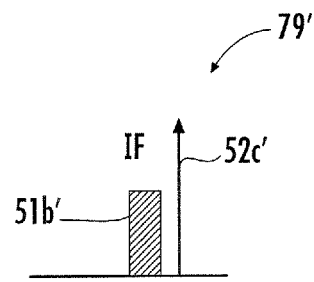
Figure 13A:
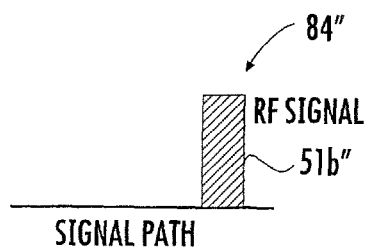
Figure 13B:
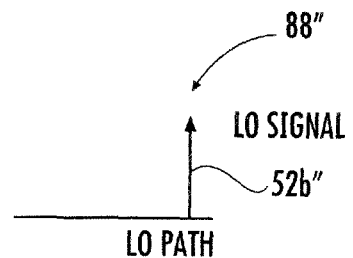
Figure 14A:
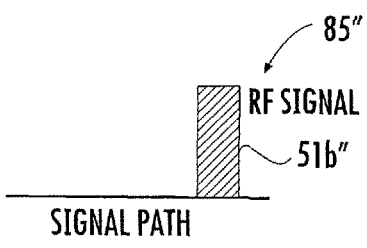
Figure 14B:
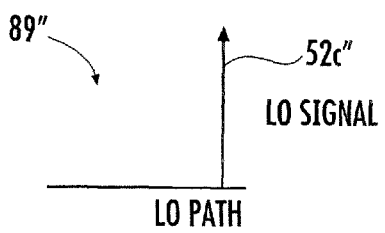
Figure 15:
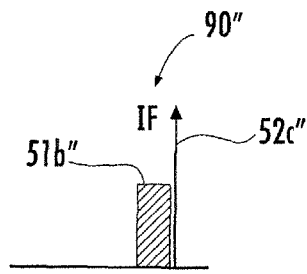

Referring now additionally to FIG. 4, another embodiment of the communications device 20" is now described. In this embodiment of the communications device 20", those elements already discussed above with respect to FIGS. 2-3 are given double prime notation and most require no further discussion herein. Also, the spectral operation of the communications device 20" is described with reference to diagrams 81"-90".

This embodiment differs from the previous embodiment in that this communications device 20" omits the splitting of the optical carrier signal from the optical source 24". In the alternative, the first band pass filter 34" illustratively includes first and second outputs respectively coupled to the second E/O modulator 27" and the O/E converter 26".

In particular, the optical carrier signal is modulated with the input signal at the first E/O modulator 23", the modulated input signal includes first and second sidebands 51a"-51b" (diagram 81"). The first band pass filter 34" illustratively passes the first 51" and second 51b" sidebands respectively to the second E/O modulator 27" and the O/E converter 26" (diagrams 82", 86").

Also, the modulated input signal from the first E/O modulator 23" is modulated with the reference signal at the second E/O modulator 27", the modulated reference signal includes first and second sidebands 52a"-52b" of the reference signal and the first side band 51a" from the input signal (diagram 87"). The second band pass filter 35" passes on the second sideband 52b" of the reference signal, which is amplified 52c" in the OIL source 28" (diagram 89"). The amplified modulated reference signal 520" is combined with second sideband 51b" of the input signal in the O/E converter 26" (diagram 90").

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:
1. A communications device comprising:
 a remote device comprising
  a first electro-optic (E/O) modulator configured to modulate an optical carrier signal with an input signal having a first frequency to generate a modulated optical carrier signal, and
  an optical waveguide coupled to said remote device; and
 a local device coupled to said optical waveguide and comprising
  an optical source configured to generate the optical carrier signal, a first band pass filter having an input configured to receive the modulated optical carrier signal for generating a modulated and filtered optical carrier signal, a second E/O modulator configured to modulate the modulated and filtered optical carrier signal with a reference signal to generate a modulated reference signal, an optical injection locking (OIL) source coupled to said second E/O modulator and configured to amplify the modulated reference signal, and an O/E converter coupled to said OIL source and configured to generate an output signal comprising a replica of the input signal at a second frequency based upon the reference signal, said first band pass filter having first and second outputs respectively coupled to said second E/O modulator and said O/E converter.

2. The communications device of claim 1 wherein said second E/O modulator is configured to generate the modulated reference signal to comprise a plurality of harmonics; and wherein said OIL source is configured to amplify a selected harmonic from the plurality thereof.

3. The communications device of claim 1 wherein said first band pass filter is configured to pass a carrier frequency sideband; and wherein said local device comprises
a second band pass filter coupled downstream from said second E/O modulator and configured to pass a reference signal frequency sideband.

4. The communications device of claim 1 wherein the first frequency is less than the second frequency.

5. The communications device of claim 1 wherein the first frequency is greater than the second frequency.

6. The communications device of claim 1 wherein said O/E converter comprises:
first and second optical detectors coupled to said OIL source; and
a combiner coupled to said first and second optical detectors.

7. The communications device of claim 1 wherein said local device comprises an amplifier coupled between said optical source and said first and second E/O modulators.

8. The communications device of claim 1 wherein said local device comprises a local oscillator configured to generate the reference signal.

9. The communications device of claim 1 wherein said remote device further comprises an antenna coupled to said first E/O modulator.

10. A communications device comprising:
a remote device comprising
a first electro-optic (E/O) modulator configured to modulate an optical carrier signal with an input signal having a first frequency to generate a modulated optical carrier signal, and
an optical waveguide coupled to said remote device; and
a local device coupled to said optical waveguide and comprising
an optical source configured to generate the optical carrier signal,
a first band pass filter coupled downstream from said first E/O modulator and configured to pass a carrier frequency sideband, said first band pass filter having an input configured to receive the modulated optical carrier signal for generating a modulated and filtered optical carrier signal, a second E/O modulator configured to modulate the modulated and filtered optical carrier signal with a reference signal to generate a modulated reference signal comprising a plurality of harmonics, a second band pass filter coupled downstream from said second E/O modulator and configured to pass a reference signal frequency sideband, an optical injection locking (OIL) source coupled to said second E/O modulator and configured to amplify a selected harmonic from the plurality thereof from the modulated reference signal, the selected harmonic being in the reference signal frequency sideband, and an O/E converter coupled to said OIL source and configured to generate an output signal comprising a replica of the input signal at a second frequency based upon the reference signal, said first band pass filter having first and second outputs respectively coupled to said second E/O modulator and said O/E converter.

11. The communications device of claim 10 wherein the first frequency is less than the second frequency.

12. The communications device of claim 10 wherein the first frequency is greater than the second frequency.

13. The communications device of claim 10 wherein said O/E converter comprises:
first and second optical detectors coupled to said OIL source; and
a combiner coupled to said first and second optical detectors.

14. The communications device of claim 10 wherein said local device comprises an amplifier coupled between said optical source and said first and second E/O modulators.

15. The communications device of claim 10 wherein said local device comprises a local oscillator configured to generate the reference signal.

16. The communications device of claim 10 wherein said remote device further comprises an antenna coupled to said first E/O modulator.

17. A communications method comprising:
generating an optical carrier signal with an optical source;
electro-optic (E/O) modulating, in a remote device with a first E/O modulator, the optical carrier signal with an input signal having a first frequency to generate a modulated optical carrier signal;
using a first band pass filter having an input to receive the modulated optical carrier signal for generating a modulated and filtered optical carrier signal;
E/O modulating, in a local device coupled to the remote device via an optical waveguide with a second E/O modulator, the modulated and filtered optical carrier signal with a reference signal to generate a modulated reference signal;
amplifying the modulated reference signal with an optical injection locking (OIL) source; and
generating with an O/E converter an electrical output signal comprising a replica of the input signal at a second frequency based upon the reference signal at the local device, the first band pass filter having first and second outputs respectively coupled to the second E/O modulator and the O/E converter.

18. The communications method of claim 17 wherein the modulated reference signal comprises a plurality of harmonics; and wherein the OIL source amplifies a selected harmonic from the plurality thereof.

19. The communications method of claim 17 further comprising:
   using the first band pass filter to pass a carrier frequency sideband; and
   using a second band pass filter to pass a reference signal frequency sideband.

20. The communications method of claim 17 wherein the first frequency is less than the second frequency.

21. The communications method of claim 17 wherein the first frequency is greater than the second frequency.

22. The communications method of claim 17 further comprising amplifying an output of the optical source.

23. The communications method of claim 17 further comprising generating the reference signal with a local oscillator.

* * * * *